US006715718B1

(12) United States Patent
Chen et al.

(10) Patent No.: US 6,715,718 B1
(45) Date of Patent: Apr. 6, 2004

(54) ADJUSTABLE BRACKET DEVICE OF A CABLE MANAGEMENT ARM FOR FURNITURE

(75) Inventors: Ken-Ching Chen, Kaohsiung Hsien (TW); Shih-Long Hwang, Kaohsiung Hsien (TW); Chun-Chiang Wang, Kaohsiung Hsien (TW); Jung-Pin Chen, Kaohsiung Hsien (TW); I-Ming Tseng, Kaohsiung Hsien (TW)

(73) Assignee: King Side Works Co., Ltd. (TW)

( * ) Notice: Subject to any disclaimer, the term of this patent is extended or adjusted under 35 U.S.C. 154(b) by 0 days.

(21) Appl. No.: 10/253,701

(22) Filed: Sep. 25, 2002

(51) Int. Cl.[7] .................................................. F16L 3/00

(52) U.S. Cl. ...................................... 248/49; 248/286.1

(58) Field of Search .......................... 248/49, 65, 67.7, 248/286.1, 291.1, 292.14, 297.4, 298, 60, 281.11; 174/50, DIG. 19; 312/223.1

(56) References Cited

U.S. PATENT DOCUMENTS 4,353,518 A * 10/1982 Taylor et al. ................. 248/60

6,286,794 B1 * 9/2001 Harbin .................... 248/123.2

OTHER PUBLICATIONS

U.S. patent application Publication US 2001/0030266 A1 to MacDonald et al. □□Publication Date Oct. 10, 2001.*

* cited by examiner

*Primary Examiner*—Ramon O. Ramirez
(74) *Attorney, Agent, or Firm*—Bacon & Thomas, PLLC

(57) ABSTRACT

An adjustable bracket device of a cable management arm. The device includes an adjustable bracket and a positioning unit adapted to position the cable management arm with respect to the adjustable bracket between a rack and a chassis. The adjustable bracket includes a guiding groove adapted to receive the positioning unit to adjust an assembled position of the cable management arm with respect to a predetermined position of the rack, to apply a universal specification of the cable management arm to various depth sizes of the rack.

10 Claims, 6 Drawing Sheets

ADJUSTABLE BRACKET DEVICE OF A CABLE MANAGEMENT ARM FOR FURNITURE

BACKGROUND OF THE INVENTION

1. Field of the Invention

The present invention is related to an adjustable bracket device of a cable management arm for furniture and more particularly to utilize an adjustable bracket, which has a guiding groove, applying to various depth sizes of a rack, which is adapted to adjust an assembled position of the cable management arm for extending and retracting in the rack to thereby avoid changing the specification of the rack, so that a universal specification of the cable management arm is capable of applying to the various depth sizes of the rack.

2. Description of the Related Art

Big industrial system, like factory computer and server, is consisted of a rack, and a plurality of individual component drawers. Large numbers of data cables and power cable connected between the rack and the component draw is usually served to communicate with other components and power supply. In order to flexibly repair and service the installed components, a cable management arm is generally used to manage these cables.

Referring to FIG. 1, a conventional cable management arm 30 comprises cable arms 31, pivotal members 32, a pair of brackets 33 and 34. The cable arms 31 are used to mount the cables (not labeled). The cable arms 31 are connected by the pivotal members, permitting the cable arms 31 to fold together. Two ends of the combination of the cable arms 31 are connected to the two brackets 33 and 34 which are fixed on predetermined positions of the component drawer 20 and the rack 10. In addition, two tracks 11 and 12 are fixed and connected between the component drawer 20 and the inner wall of the rack 10. When the component drawer 20 moves fowards or rearwards along the track 11 and 12 on the inner wall of the rack 10, the cable arms 31 are extended or extracted.

A specific cable management arm 30 is applied to a specific depth size of the rack 10 even though it is convenient for extraction, repair and service. There is a need for a new length specification or a different series count for the cable arms 31 when launching a new specification of the rack 10 in a market. Accordingly, manufacturers cannot reduce manufacturing cost or apply to various depth sizes of the rack 10.

The present invention intends to provide an adjustable bracket device of a cable management arm having a guiding groove adapted to adjust an assembled position of a cable arm with respect to a rack in such a way to mitigate and overcome the above problem.

SUMMARY OF THE INVENTION

The primary objective of this invention is to provide an adjustable bracket device of a cable management arm comprising a guiding groove and a positioning unit to thereby choose an assembled position of the cable management arm with respect to the rack, so as to improving useful flexibility and convenient assembling.

The adjustable bracket device of the cable management arm of the present invention mainly comprises an adjustable bracket, and a positioning unit adapted to position the cable management arm with respect to the adjustable bracket between a rack and a chassis. The adjustable bracket includes a guiding groove adapted to receive the positioning unit to adjust an assembled position of the cable management arm with respect to a predetermined position of the rack, to thereby apply a universal specification of the cable management arm to various depth sizes of the rack.

Other objectives, advantages and novel features of the invention will become more apparent from the following detailed description and the accompanying drawings.

BRIEF DESCRIPTION OF THE DRAWINGS

The present invention will now be described in detail with reference to the accompanying drawings herein.

DETAILED DESCRIPTION OF THE INVENTION

Figure 2:
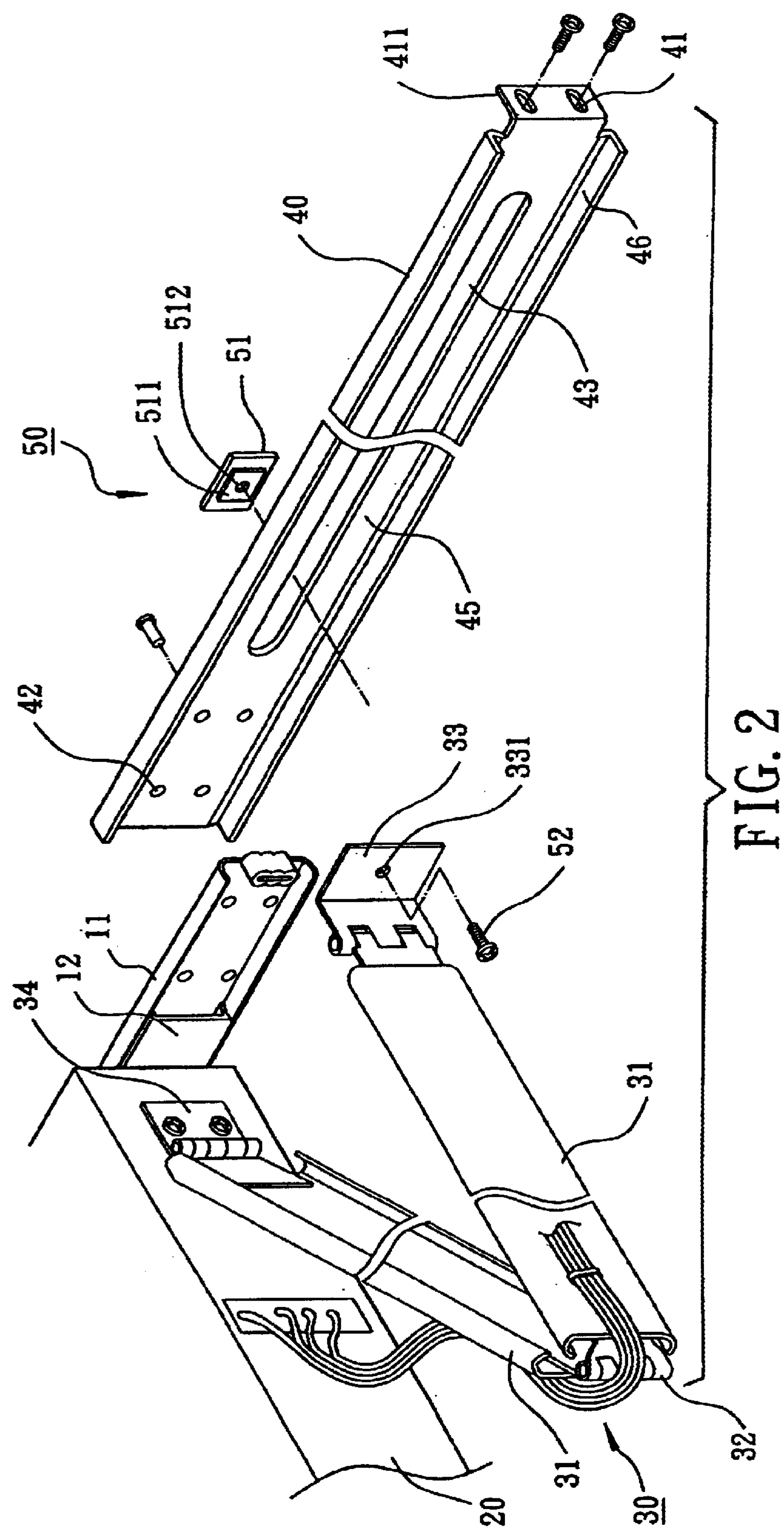
FIG. 2 is a perspective view of an adjustable bracket device of a cable management arm in accordance with a first embodiment of the present invention.
Figures 3, 4:
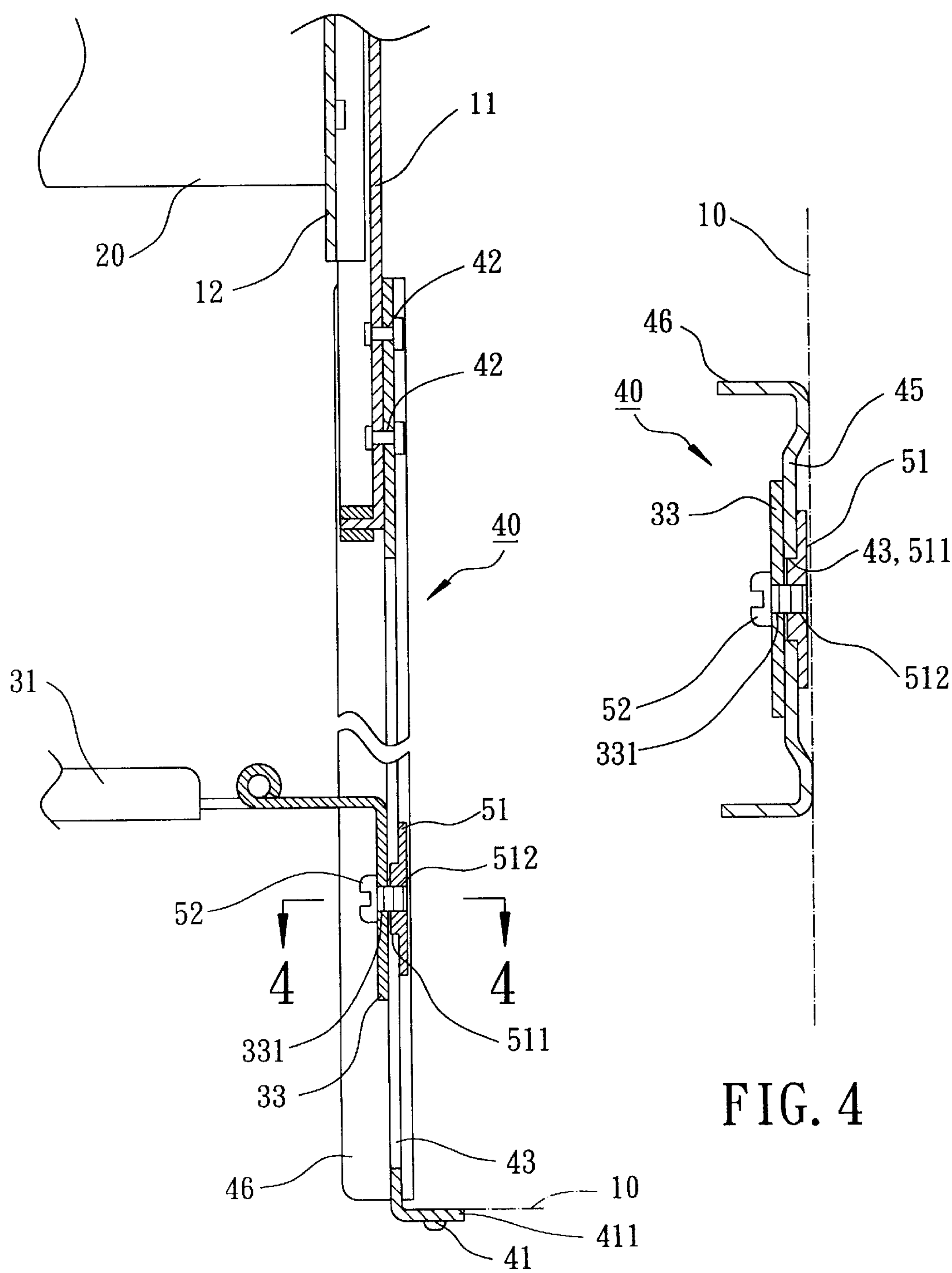
FIG. 3 is a sectional view of the adjustable bracket device of the cable management arm in accordance with the first embodiment of the present invention.
FIG. 4 is a cross-sectional view, taken along line 4—4 in FIG. 3, of the adjustable bracket device of the cable management arm in accordance with the first embodiment of the present invention.

Referring initially to FIGS. 2 through 4, an adjustable bracket device in accordance with a first embodiment of the present invention mainly includes an adjustable bracket 40 and a positioning unit 50. The adjustable bracket 40 is assembled between a rack 10 and a cable management arm 30 of a chassis 20. The adjustable bracket 40 comprises first fixing holes 41, second fixing holes 42 and a guiding groove 43. The positioning unit 50 comprises a positioning plate 51 and a fixing member 52. The adjustable bracket 40 and a track 11 are mounted to an inner surface of the rack 10 together by means of the fixing holes 41 and 42, and fixing members (not labeled). The guiding groove 43 is extended on an elongated protrusion 45 parallel to the adjusting bracket 40.

Referring again to FIGS. 3 and 4, the positioning plate 51 is stacked between the elongated protrusion 45 and the inner surface of the rack 10. The positioning plate 51 includes an engaging portion 511, a screw hole 512, and a fixing member 52. The engaging portion 511 is slidable and aligned with the guiding groove 43 while the fixing member 52 is successively passed through a through hole 331 of a bracket 33 and the guiding groove 43, thereby the bracket 33 intimately engaging with an edge of the guiding groove 43.

Figure 5:
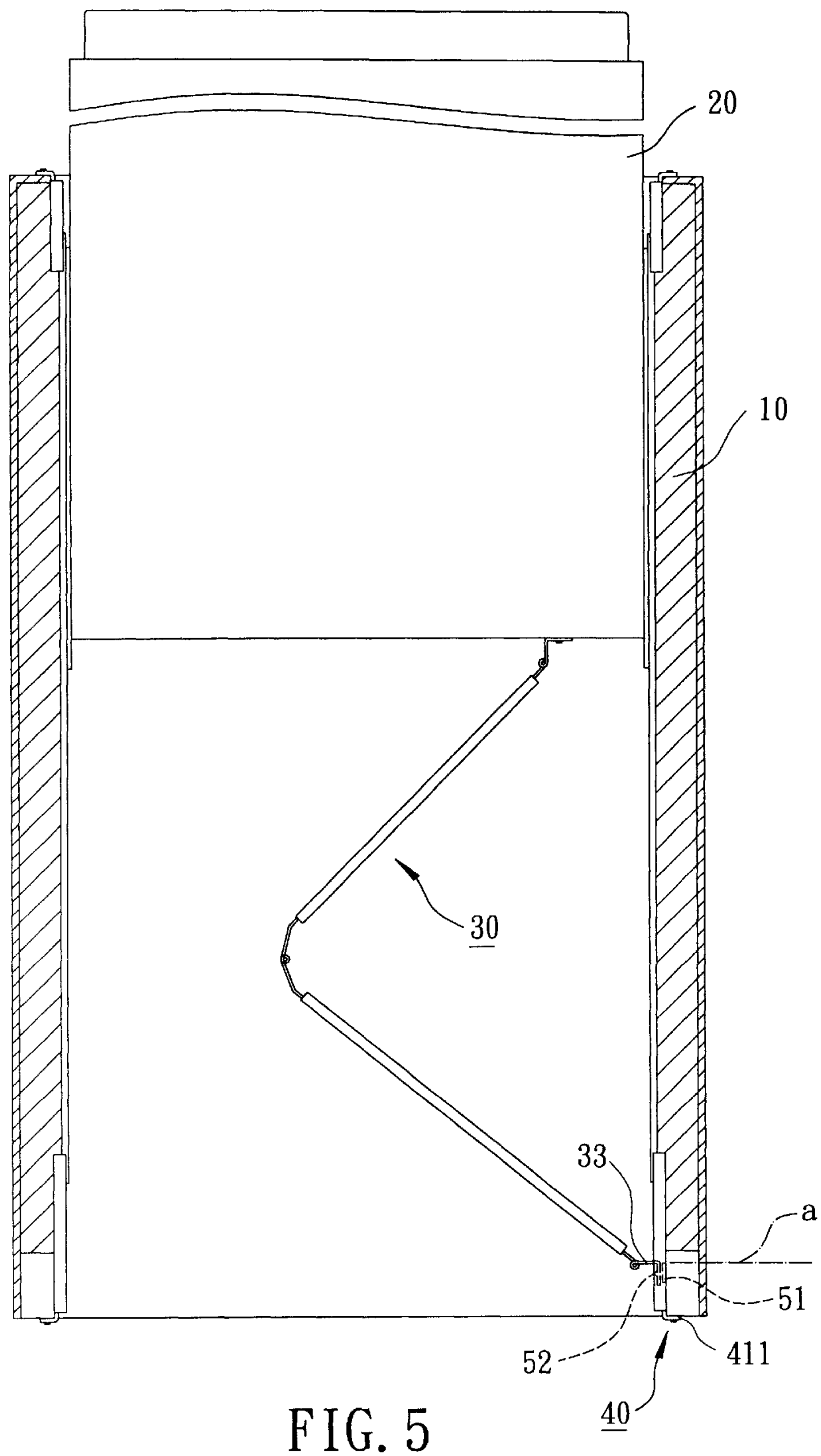
FIG. 5 is a schematic view of the adjustable bracket device of the first embodiment assembled in a shorter depth of a rack.
Figure 6:
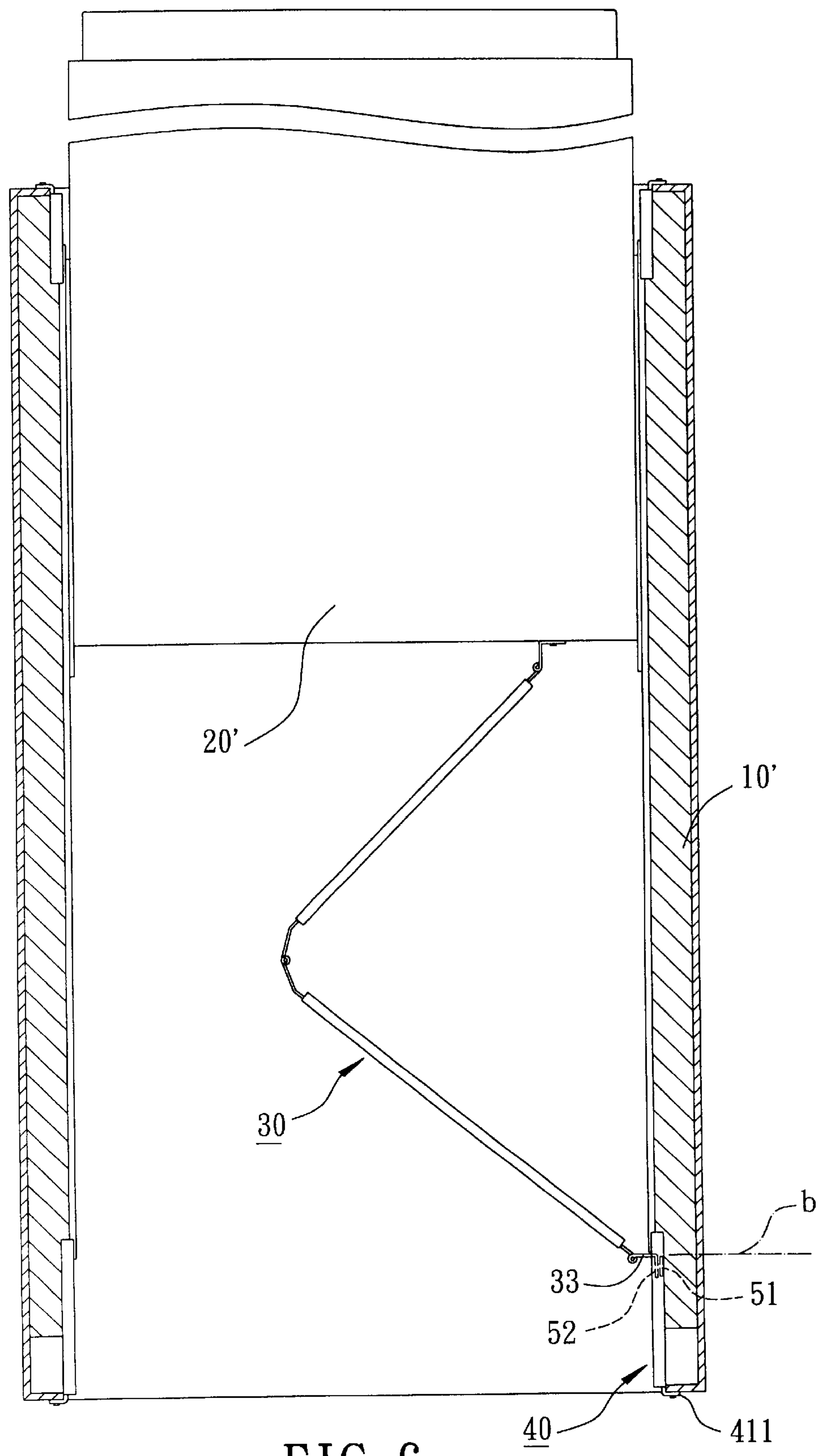
FIG. 6 is a schematic view of the adjustable bracket device of the first embodiment assembled in a longer depth of a rack.

FIGS. 5 and 6 illustrate the adjustable bracket device in accordance with the first embodiment of the present invention applied to two different depth sizes of the rack 10. When the cable management arm 30 with a specific length is applied to a shorter depth of the rack 10, the bracket 33 of the cable management arm 30 is attached to the chassis 20 and the adjustable bracket 40 by the positioning plate 51 and fixing member 52, as shown in FIG. 5. Accordingly, the cable management arm 30 is selectively positioned at a rear position "a" of the adjustable bracket 40 proximal the rear edge of the rack 10. When the cable management arm 30 is applied to a longer depth of the rack 10', the cable management arm 30, which is attached to the chassis 20' and the adjustable bracket 40, is selectively positioned at a front position "b" of the adjustable bracket 40 away from the rear edge of the rack 10'. Consequently, a universal specification of the cable management arm 30 is capable of conveniently assembling to the various depth sizes of the rack 10 by means of adjusting the assembled positions of the bracket 33 with respect to the adjustable bracket 40.

Referring again to FIGS. 5 and 6, the combination of the adjusting bracket 40 and the cable management arm 30 is capable of widely applying to the racks 10 and 10', including maximum depth 90 cm and minimum depth 60 cm for example. Preferably, maximum extension of the cable management arm 30 is designed 60 cm through 90 cm in addition to adjusting the assembled position on the adjusting bracket 40. In addition, the adjustable bracket 40 is integrated into the track 11 to simplify entire structure and conveniently assemble. The adjusting bracket 40 further comprises a pair of bent portions 46 to thereby intensify entire structure or confine sliding movement of the bracket 33 attaching to the cable management arm 30. The fixing holes 41 are provided on a bent portion 411 which is engaged with the rear edge of the rack 10 to avoid occurring displacement of the adjusting bracket 40.

Figures 7, 8:
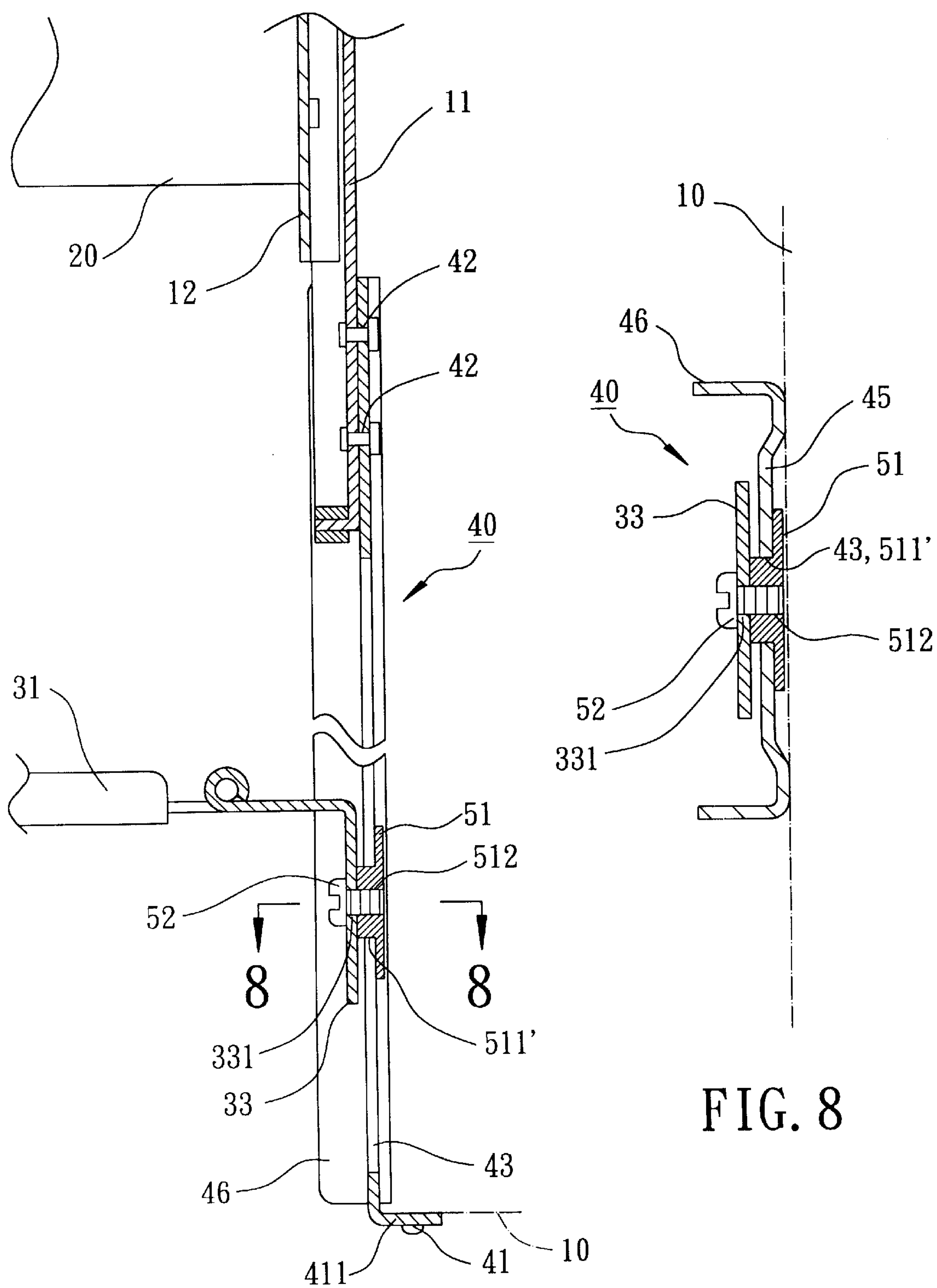
FIG. 7 is a sectional view of the adjustable bracket device of the cable management arm in accordance with a second embodiment of the present invention.
FIG. 8 is a cross-sectional view, taken along line 8—8 in FIG. 7, of the adjustable bracket device of the cable management arm in accordance with the first embodiment of the present invention.

Referring to FIGS. 7 and 8, an adjustable bracket device in accordance with a second embodiment of the present invention mainly includes a positioning plate 51 and an engaging portion 511'. The thickness and width of the engaging portion 511' are thicker than that of the adjusting bracket 40 and narrower than that of the guiding groove 43 respectively. Accordingly, the inner edge of the guiding groove 43 may not be intimately engaged with the bracket 33 to avoid abrasion when it is moving on the adjusting bracket 40. When the chassis 20 is pulled out or pushed back in the rack 10 for extending or folding the cable management arm 30, the bracket 33 is capable of moving in the guiding groove 43 synchronously. Therefore, the adjusting bracket 40 and the positioning plate 52 are capable of smoothing extension and folding movement of the cable management arm 30.

Figure 1:
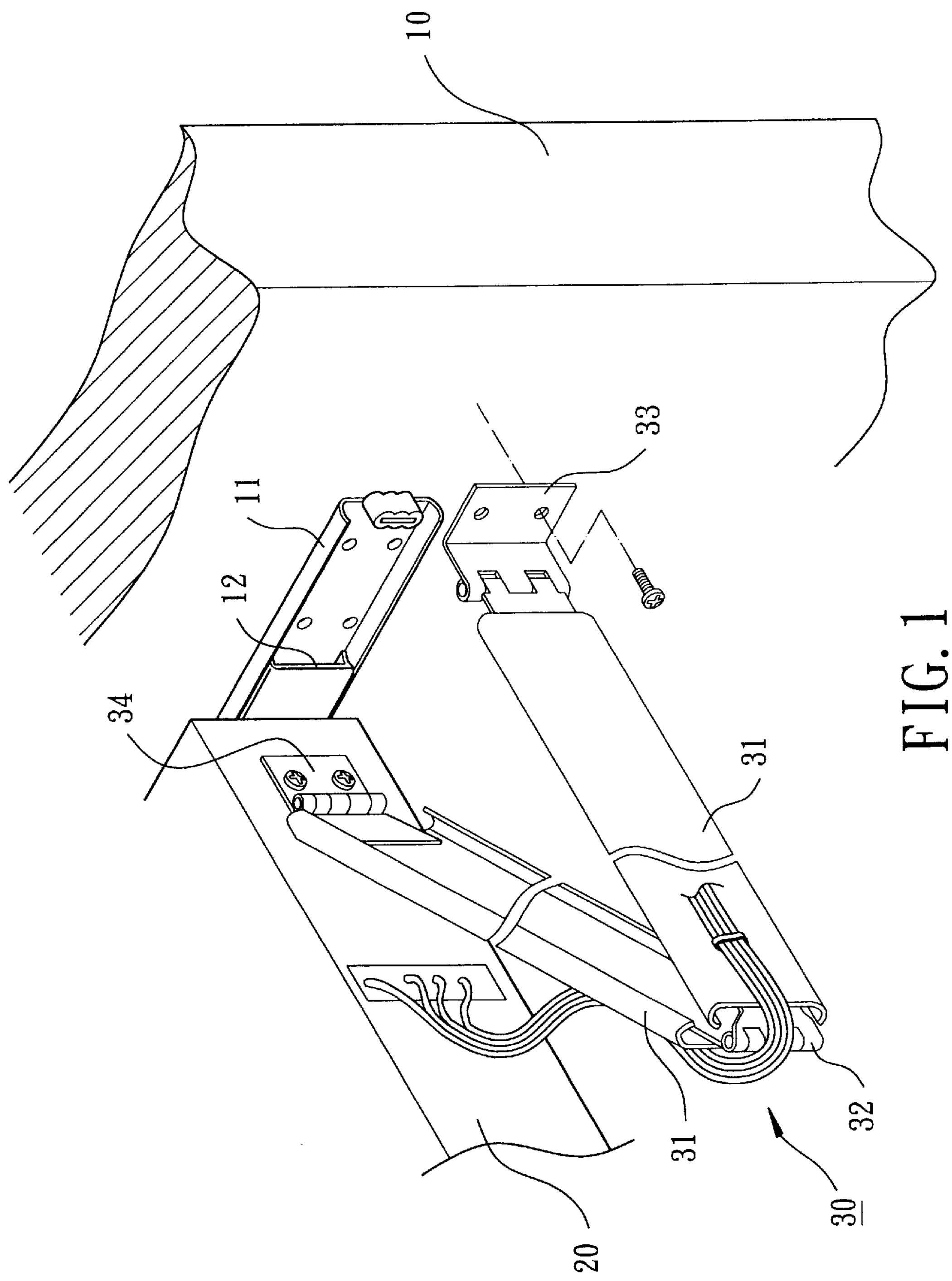
FIG. 1 is a perspective view of a conventional cable management arm in accordance with the prior art.

Referring to FIGS. 1 and 2, the adjustable bracket device of the cable management arm 30 in accordance with the present invention is used to conveniently adjust the assembled position of the cable management arm 30. Namely, the guiding groove 43 of the adjusting bracket 40 and the positioning plate 51 accomplish a universal specification of the cable management arm 30 being capable of applying to various depth sizes of the rack 10. By contrast, the conventional cable management arm 30 must be changed count or length of the cable arm 31 adapted to apply to various depth sizes of the rack 10.

Although the invention has been described in detail with reference to its presently preferred embodiment, it will be understood by one of ordinary skill in the art that various modifications can be made without departing from the spirit and the scope of the invention, as set forth in the appended claims.

What is claimed is:

1. An adjustable bracket device connected between a cable management arm and a rack, comprising:

an adjustable bracket fixed on an inner surface of the rack and including a guiding groove; and a positioning unit comprising a positioning plate and a fixing member, the positioning unit adapted to position an assembled position of the cable management arm with respect to the adjustable bracket between a chassis and the rack to thereby apply a specification of the cable management arm to various depth sizes of the rack.

2. The adjustable bracket device as defined in claim 1, wherein the guiding groove is extended on an elongated protrusion parallel to the adjustable bracket.

3. The adjustable bracket device as defined in claim 1, wherein the positioning plate of the positioning unit includes an engaging portion projected therefrom, and a screw hole.

4. The adjustable bracket device as defined in claim 1, wherein the adjustable bracket further includes fixing holes formed on an end of the adjustable bracket proximal to a rear end of the rack.

5. The adjustable bracket device as defined in claim 1, wherein the adjustable bracket further includes fixing holes formed on an end of the adjustable bracket distanced from a rear end of the rack.

6. The adjustable bracket device as defined in claim 1, wherein the adjustable bracket further includes a bent portion engaged with a rear edge of the rack and configured to avoid displacement of the adjustable bracket.

7. The adjustable bracket device as defined in claim 1, wherein the adjustable bracket further comprises a pair of bent portions configured to strengthen the adjustable bracket device.

8. The adjustable bracket device as defined in claim 1, wherein the cable management arm comprises two ends having two brackets attached to the rack and a chassis.

9. The adjustable bracket device as defined in claim 1, wherein the inner surface of the rack is further provided with a plurality of tracks adapted to move a chassis.

10. The adjustable bracket device as defined in claim 9, wherein the adjustable bracket is integrated into the track.

* * * * *